United States Patent
Sorensen et al.

(10) Patent No.: US 11,508,742 B2
(45) Date of Patent: Nov. 22, 2022

(54) DEVICES INCLUDING STAIR STEP STRUCTURES ADJACENT SUBSTANTIALLY PLANAR, VERTICALLY EXTENDING SURFACES OF A STACK STRUCTURE

(71) Applicant: Micron Technology, Inc., Boise, ID (US)

(72) Inventors: Troy R. Sorensen, Boise, ID (US); Mohd Kamran Akhtar, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 58 days.

(21) Appl. No.: 16/676,817

(22) Filed: Nov. 7, 2019

(65) Prior Publication Data

US 2020/0118919 A1    Apr. 16, 2020

Related U.S. Application Data

(62) Division of application No. 15/271,924, filed on Sep. 21, 2016, now Pat. No. 10,504,838.

(51) Int. Cl.
*H01L 27/11548* (2017.01)
*H01L 23/528* (2006.01)
(Continued)

(52) U.S. Cl.
CPC .. *H01L 27/11548* (2013.01); *H01L 21/31144* (2013.01); *H01L 21/76802* (2013.01);
(Continued)

(58) Field of Classification Search
CPC ......... H01L 27/11548; H01L 27/11575; H01L 27/11551; H01L 27/11578;
(Continued)

(56) References Cited

U.S. PATENT DOCUMENTS 7,852,676 B2   12/2010   Maejima
8,284,601 B2   10/2012   Son et al.
(Continued)

FOREIGN PATENT DOCUMENTS

CN   104051326 B   9/2017
CN   105845551 A   1/2021
(Continued)

OTHER PUBLICATIONS

European Communication pursuant to Article 94(3) EPC for European Application No. 17192331.1, dated Mar. 17, 2021, 8 pages.
(Continued)

*Primary Examiner* — Steven B Gauthier
*Assistant Examiner* — Candice Chan
(74) *Attorney, Agent, or Firm* — TraskBritt

(57) ABSTRACT

A method of forming a semiconductor device structure comprises forming a stack structure over a substrate, the stack structure comprising tiers each independently comprising a sacrificial structure and an insulating structure and longitudinally adjacent the sacrificial structure. A masking structure is formed over a portion of the stack structure. A photoresist is formed over the masking structure and over additional portions of the stack structure not covered by the masking structure. The photoresist and the stack structure are subjected to a series of material removal processes to selectively remove portions of the photoresist and portions of the stack structure not covered by one or more of the masking structure and remaining portions of the photoresist to form a stair step structure. Semiconductor devices and additional methods of forming a semiconductor device structure are also described.

6 Claims, 8 Drawing Sheets

(51) Int. Cl.
*H01L 23/522* (2006.01)
*H01L 27/11556* (2017.01)
*H01L 27/11582* (2017.01)
*H01L 27/11575* (2017.01)
*H01L 21/311* (2006.01)
*H01L 21/768* (2006.01)

(52) U.S. Cl.
CPC ...... *H01L 21/76877* (2013.01); *H01L 23/528* (2013.01); *H01L 23/5226* (2013.01); *H01L 27/11556* (2013.01); *H01L 27/11575* (2013.01); *H01L 27/11582* (2013.01)

(58) Field of Classification Search
CPC ......... H01L 27/11524; H01L 27/11529; H01L 27/11286; H01L 27/11293; H01L 27/11213; H01L 27/1128
See application file for complete search history.

(56) References Cited

U.S. PATENT DOCUMENTS

| | | | |
|---|---|---|---|
| 8,530,350 | B2 | 9/2013 | Freeman et al. |
| 8,609,536 | B1 | 12/2013 | Ha et al. |
| 8,614,917 | B2 | 12/2013 | Shim et al. |
| 8,796,778 | B2 | 8/2014 | Tanzawa |
| 2004/0259355 | A1 | 12/2004 | Yin et al. |
| 2006/0286793 | A1 | 12/2006 | Lin et al. |
| 2009/0268522 | A1 | 10/2009 | Maejima |
| 2009/0268523 | A1 | 10/2009 | Maejima |
| 2009/0310415 | A1 | 12/2009 | Jin et al. |
| 2010/0207186 | A1 | 8/2010 | Higashi et al. |
| 2011/0244666 | A1 | 10/2011 | Kim et al. |
| 2012/0091413 | A1 | 4/2012 | Nguyen et al. |
| 2012/0119287 | A1 | 5/2012 | Park et al. |
| 2012/0306089 | A1 | 12/2012 | Freeman et al. |
| 2013/0146980 | A1 | 6/2013 | Tanzawa |
| 2014/0061747 | A1 | 3/2014 | Tanzawa et al. |
| 2014/0138840 | A1 | 5/2014 | Ha et al. |
| 2014/0162420 | A1 | 6/2014 | Oh et al. |
| 2014/0241026 | A1 | 8/2014 | Tanzawa |
| 2014/0264925 | A1 | 9/2014 | Chen |
| 2014/0347929 | A1 | 11/2014 | Tanzawa |
| 2015/0001613 | A1* | 1/2015 | Yip .................. H01L 27/11582 257/329 |
| 2016/0027614 | A1 | 1/2016 | Manna et al. |
| 2016/0225632 | A1 | 8/2016 | Shaikh et al. |

FOREIGN PATENT DOCUMENTS

| | | |
|---|---|---|
| JP | 2010-192589 A | 9/2010 |
| JP | 2015-133355 A | 7/2015 |
| JP | 2014-042029 A5 | 9/2016 |
| JP | 2016-166405 A | 9/2016 |

OTHER PUBLICATIONS

Japanese Office Action for Application No. 2017-161492, dated Jun. 16, 2020, 16 pages.
European Search Report from European Application No. 17192331.1, dated Feb. 1, 2018, 9 pages.
Japanese Decision of Rejection from Japanese Application No. 2017161492, dated Jun. 25, 2019, 11 pages.
Japanese Notice of Rejection Grounds from Japanese Application No. 2017-161492, dated Nov. 26, 2018, 8 pages.
Korean Notice of Reasons for Rejection from Korean Application No. 10-2017-0121170, dated Nov. 21, 2018, 14 pages.
Chinese Office Action for Application No. 201710853490.3, dated Nov. 30, 2020, 18 pages.
Chinese Office Action for Application No. 201710853490.3, dated Nov. 23, 2021, 12 pages.
Chinese Second Office Action for Application No. 201710853490.3, dated Aug. 3, 2021, 17 pages.

* cited by examiner

DEVICES INCLUDING STAIR STEP STRUCTURES ADJACENT SUBSTANTIALLY PLANAR, VERTICALLY EXTENDING SURFACES OF A STACK STRUCTURE

CROSS-REFERENCE TO RELATED APPLICATION

This application is a divisional of U.S. patent application Ser. No. 15/271,924, filed Sep. 21, 2016, now U.S. Pat. No. 10,504,838, issued Dec. 10, 2019, the disclosure of which is hereby incorporated herein in its entirety by this reference.

TECHNICAL FIELD

The disclosure, in various embodiments, relates generally to the field of semiconductor device design and fabrication. More specifically, the disclosure relates to methods of forming a semiconductor device structure including a stair step structure, and to related semiconductor device structures and semiconductor devices.

BACKGROUND

A continuing goal of the semiconductor industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A typical vertical memory array includes semiconductor pillars extending through openings in tiers of conductive structures (e.g., word line plates, control gate plates) and dielectric materials at each junction of the semiconductor pillars and the conductive structures. Such a configuration permits a greater number of transistors to be located in a unit of die area by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., word lines) so that memory cells in the vertical memory array can be uniquely selected for writing, reading, or erasing operations. One method of forming such an electrical connection includes forming a so-called "stair step" structure at edges (e.g., lateral ends) of the tiers of conductive structures. The stair step structure includes individual "steps" defining contact regions of the conductive structures upon which contact structures can be positioned to provide electrical access to the conductive structures.

Conventional processes for forming a stair step structure generally include repeated acts of trimming a photoresist overlying alternating conductive structures and insulating structures, etching portions of the insulating structures not covered by a remaining portion of the photoresist, and then etching portions of the conductive structures not covered by remaining portions of the insulating structures. Such conventional processes typically result in the formation of so-called "stadium" structures exhibiting opposing and symmetric stair step structures. A first stair step structure on a first end of a stadium structure typically mirrors a second stair step structure on a second end of the stadium structure. The first stair step structure and the second stair step structure generally exhibit substantially the same size and substantially the same shape, but the first stair step structure outwardly extends in a direction that opposes a direction in which the second stair step structure outwardly extends. For various applications, however, only one stair step structure (e.g., only the first stair step structure or only the second stair step structure) of the stadium structure is used to make electrical connections, and the other stair step structure (e.g., the second stair step structure or the first stair step structure) of the stadium structure is underutilized and/or occupies space that could otherwise be utilized for another, more desirable purpose.

It would, therefore, be desirable to have improved methods of forming stair step structures for semiconductor devices (e.g., vertical memory devices, such as 3D NAND Flash memory devices) that reduce, if not eliminate, the aforementioned problems.

DETAILED DESCRIPTION

Figure 1A:
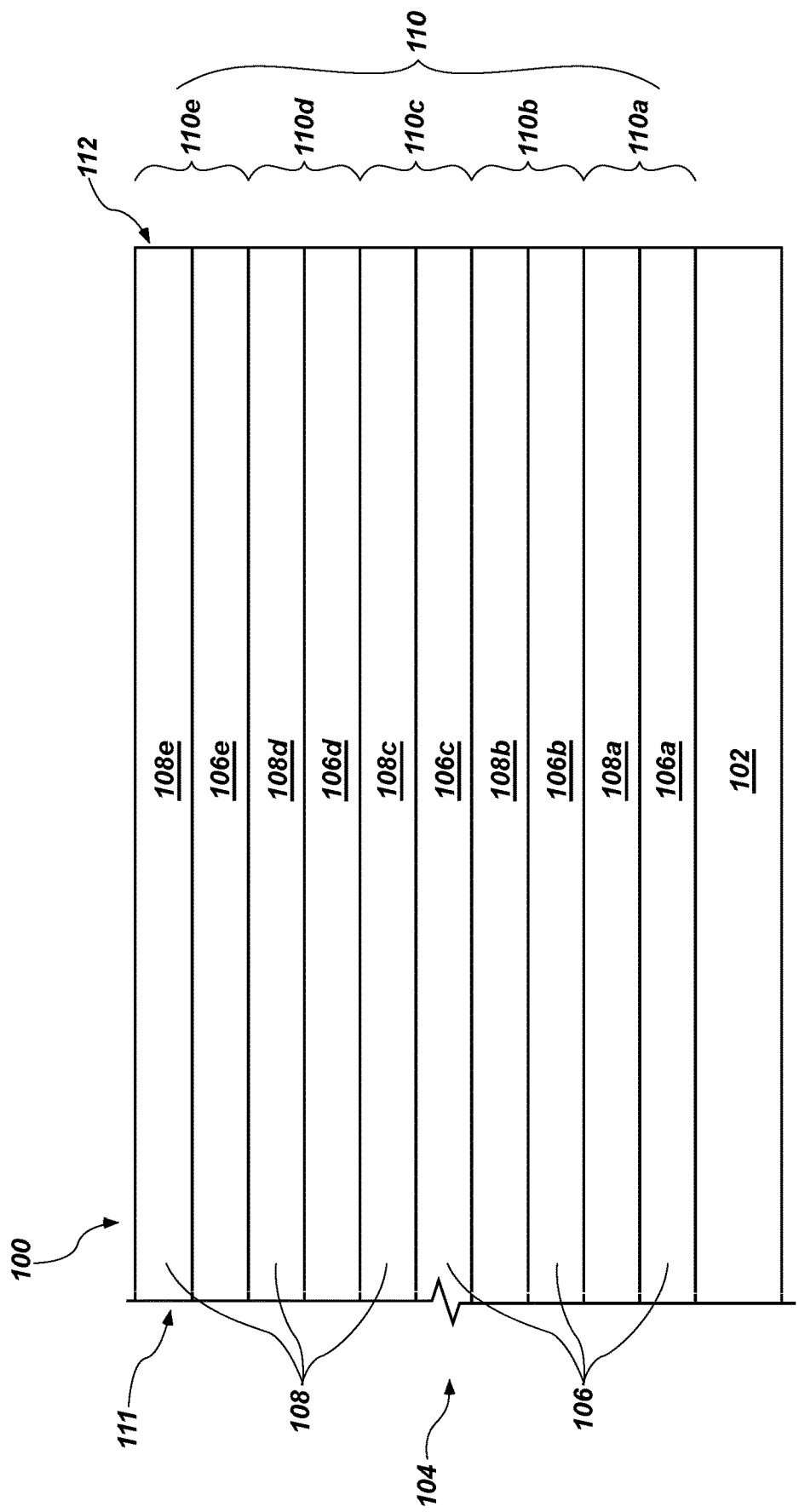
FIGS. 1A through 1G are cross-sectional views illustrating different process stages and structures for a method of forming a semiconductor device structure including a stair step structure, in accordance with an embodiment of the disclosure.

Methods of forming a semiconductor device structure including a stair step structure are described, as are related semiconductor device structures and semiconductor devices (e.g., vertical memory devices, such as 3D NAND Flash memory devices). In some embodiments, a method of forming a semiconductor device structure includes forming a stack structure over a substrate. The stack structure may include sacrificial structures and insulating structures arranged in tiers. Each of the tiers may independently include one of the sacrificial structures and one of the insulating structures. A masking structure (e.g., a hard mask structure) may be formed on or over a portion of the stack structure, and a photoresist may be formed on or over the masking structure and on or over additional portions of the stack structure not covered by the masking structure. The photoresist and the stack structure may then be subjected to a series of material removal processes to form a stair step structure. The material removal processes may selectively remove portions of the photoresist, and may also selectively remove portions of the stack structure not covered by one or more of the masking structure and remaining portions of the photoresist. The configuration and position of the masking structure facilitates the formation of the stair step structure without the formation of an opposing stair step structure that mirrors (e.g., is the mirror image of) the stair step structure. Following the formation of the stair step structure, remaining portions of the masking structure and the photoresist (if any) may be removed, and at least a portion of the sacrificial structure of each of the tiers may be replaced with at least one conductive material to form a conductive structure in each of the tiers. Conductive contact structures may then be coupled to the conductive structures of the tiers at the steps of the stair step structure. The methods and structures of the disclosure may enhance the utilized space of semiconductor device structures including stair step structures, facilitating the efficient formation of semiconductive devices exhibiting improved performance as compared to conventional semiconductive devices.

The following description provides specific details, such as material compositions and processing conditions, in order to provide a thorough description of embodiments of the present disclosure. However, a person of ordinary skill in the art would understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device. The semiconductor device structures described below do not form a complete semiconductor device. Only those process acts and structures necessary to understand the embodiments of the present disclosure are described in detail below. Additional acts to form a complete semiconductor device from the semiconductor device structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the term "substrate" means and includes a base material or construction upon which additional materials are formed. The substrate may be a semiconductor substrate, a base semiconductor layer on a supporting structure, a metal electrode, or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. By way of non-limiting example, a substrate may comprise at least one of silicon, silicon dioxide, silicon with native oxide, silicon nitride, a carbon-containing silicon nitride, glass, semiconductor, metal oxide, metal, a titanium nitride, a carbon-containing titanium nitride, tantalum, a tantalum nitride, a carbon-containing tantalum nitride, niobium, a niobium nitride, a carbon-containing niobium nitride, molybdenum, a molybdenum nitride, a carbon-containing molybdenum nitride, tungsten, a tungsten nitride, a carbon-containing tungsten nitride, copper, cobalt, nickel, iron, aluminum, and a noble metal.

As used herein, the terms "vertical," "longitudinal," "horizontal," and "lateral" are in reference to a major plane of a substrate in or on which the structures described are formed and are not necessarily defined by earth's gravitational field. A "horizontal" or "lateral" direction is a direction that is substantially parallel to the major plane of the substrate, while a "vertical" or "longitudinal" direction is a direction that is substantially perpendicular to the major plane of the substrate. The major plane of the substrate is defined by a surface of the substrate having a relatively large area compared to other surfaces of the substrate, such as by a substantially planar circular surface of a conventional semiconductor wafer substrate.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below," or "beneath," or "under," or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, and arrangement of one or more of at least one structure and at least one apparatus facilitating operation of one or more of the structure and the apparatus in a pre-determined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "about" in reference to a given parameter is inclusive of the stated value and has the meaning dictated by the context (e.g., it includes the degree of error associated with measurement of the given parameter).

FIGS. 1A through 1G are simplified partial cross-sectional views illustrating embodiments of a method of forming a semiconductor device structure including a stair step structure, such as a semiconductor device structure for a vertical memory device (e.g., a 3D NAND Flash memory device). With the description provided below, it will be readily apparent to one of ordinary skill in the art that the methods described herein may be used in various devices. In other words, the methods of the disclosure may be used whenever it is desired to form a stair step structure.

Referring to FIG. 1A, a semiconductor device structure 100 may include a substrate 102, and a stack structure 104 exhibiting an alternating sequence of sacrificial structures 106 and insulating structures 108 arranged in tiers 110. For clarity and ease of understanding of the drawings and related description, FIG. 1A shows the stack structure 104 as including five (5) tiers 110 of the sacrificial structures 106 and the insulating structures 108. A first tier 110a includes a first sacrificial structure 106a and a first insulating structure 108a over the first sacrificial structure 106a; a second tier 110b overlies the first tier 110a, and includes a second sacrificial structure 106b and a second insulating structure 108b over the second sacrificial structure 106b; a third tier 110c overlies the second tier 110b, and includes a third sacrificial structure 106c and a third insulating structure 108c over the third sacrificial structure 106c; a fourth tier 110d overlies the third tier 110c, and includes a fourth sacrificial structure 106d and a fourth insulating structure 108d over the fourth sacrificial structure 106d; and a fifth tier 110e overlies the fourth tier 110d, and includes a fifth sacrificial structure 106e and a fifth insulating structure 108e over the fifth sacrificial structure 106e. However, the semiconductor device structure 100 may include a different number of tiers 110. For example, in additional embodiments, the semiconductor device structure 100 may include greater than five (5) tiers 110 (e.g., greater than or equal to ten (10) tiers 110, greater than or equal to twenty-five (25) tiers 110, greater than or equal to fifty (50) tiers 110, greater than or equal to one hundred (100) tiers 110) of the sacrificial structures 106 and the insulating structures 108, or may include less than five (5) tiers 110 (e.g., less than or equal to three (3) tiers 110) of the sacrificial structures 106 and the insulating structures 108.

The sacrificial structures 106 may each be formed of and include at least one material that may be selectively removed relative to insulating material of the insulating structures 108. The at least one material of the sacrificial structures 106 may, for example, comprise one or more of an insulating material (e.g., an insulating material different than the insulating material of the insulating structures 108), a semiconductive material, and a conductive material formulated to be selectively removed relative to the insulating material of the insulating structures 108. In some embodiments, the sacrificial structures 106 comprise at least one insulating material, such as one or more of an oxide material (e.g., silicon dioxide, phosphosilicate glass, borosilicate glass, borophosphosilicate glass, fluorosilicate glass, titanium dioxide, zirconium dioxide, hafnium dioxide, tantalum oxide, magnesium oxide, aluminum oxide, or combinations thereof), a nitride material (e.g., silicon nitride), an oxynitride material (e.g., silicon oxynitride), amorphous carbon. In additional embodiments, the sacrificial structures 106 comprise at least one semiconductive material, such as undoped polycrystalline silicon. In further embodiments, the sacrificial structures 106 comprise at least one conductive material, such as conductively-doped polycrystalline silicon. Each of the sacrificial structures 106 may independently be substantially homogeneous or substantially heterogeneous. In some embodiments, each of the sacrificial structures 106 is substantially homogeneous. In further embodiments, at least one of the sacrificial structures 106 is substantially heterogeneous. One or more of the sacrificial structures 106 may, for example, be formed of and include a stack (e.g., laminate) of at least two different materials. In some embodiments, each of the sacrificial structures 106 is formed of and includes silicon nitride. The sacrificial structures 106 may each be substantially planar, and may each independently exhibit any desired thickness.

Each of the sacrificial structures 106 may be substantially the same (e.g., exhibit substantially the same material composition, material distribution, size, and shape) as one another, or at least one of the sacrificial structures 106 may be different (e.g., exhibit one or more of a different material composition, a different material distribution, a different size, and a different shape) than at least one other of the sacrificial structures 106. As non-limiting example, each of the first sacrificial structure 106a, the second sacrificial structure 106b, the third sacrificial structure 106c, the fourth sacrificial structure 106d, and the fifth sacrificial structure 106e may exhibit substantially the same material composition, material distribution, and thickness. As another non-limiting example, at least one of the first sacrificial structure 106a, the second sacrificial structure 106b, the third sacrificial structure 106c, the fourth sacrificial structure 106d, and the fifth sacrificial structure 106e may exhibit one or more of a different material composition, a different material distribution, and a different thickness than at least one other of the first sacrificial structure 106a, the second sacrificial structure 106b, the third sacrificial structure 106c, the fourth sacrificial structure 106d, and the fifth sacrificial structure 106e. In some embodiments, each of the sacrificial structures 106 is substantially the same as each other of the sacrificial structures 106.

The insulating structures 108 may be formed of and include at least one insulating material, such as one or more of an oxide material (e.g., silicon dioxide, phosphosilicate glass, borosilicate glass, borophosphosilicate glass, fluorosilicate glass, titanium dioxide, zirconium dioxide, hafnium dioxide, tantalum oxide, magnesium oxide, aluminum oxide, or a combination thereof), a nitride material (e.g., silicon nitride), an oxynitride material (e.g., silicon oxynitride), and amorphous carbon. Each of the insulating structures 108 may independently be substantially homogeneous or substantially heterogeneous. In some embodiments, each of the insulating structures 108 is substantially homogeneous. In additional embodiments, at least one of the insulating structures 108 is substantially heterogeneous. One or more of the insulating structures 108 may, for example, be formed of and include a stack (e.g., laminate) of at least two different insulating materials. In some embodiments, each of the insulating structures 108 is formed of and includes silicon dioxide. The insulating structures 108 may each be substantially planar, and may each independently exhibit any desired thickness.

Each of the insulating structures 108 may be substantially the same (e.g., exhibit substantially the same material composition, material distribution, size, and shape) as one another, or at least one of the insulating structures 108 may be different (e.g., exhibit one or more of a different material composition, a different material distribution, a different size, and a different shape) than at least one other of the insulating structures 108. As non-limiting example, each of the first insulating structure 108a, the second insulating structure 108b, the third insulating structure 108c, the fourth insulating structure 108d, and the fifth insulating structure 108e may exhibit substantially the same material composition, material distribution, and thickness. As another non-limiting example, at least one of the first insulating structure 108a, the second insulating structure 108b, the third insulating structure 108c, the fourth insulating structure 108d, and the fifth insulating structure 108e may exhibit one or more of a different material composition, a different material distribution, and a different thickness than at least one other of the first insulating structure 108a, the second insulating structure 108b, the third insulating structure 108c, the fourth insulating structure 108d, and the fifth insulating structure 108e. In some embodiments, each of the insulating structures 108 is substantially the same as each other of the insulating structures 108.

As shown in FIG. 1A, in some embodiments, the alternating sequence of the sacrificial structures 106 and the insulating structures 108 begins with one of the sacrificial structures 106. In additional embodiments, the sacrificial structures 106 and the insulating structures 108 exhibit a different arrangement relative to one another. By way of non-limiting example, the sacrificial structures 106 and the insulating structures 108 may be arranged in an alternating sequence beginning with one of the insulating structures 108. In some embodiments, each of the tiers 110 includes one of the insulating structures 108 on or over one of the sacrificial structures 106. In additional embodiments, each of the tiers 110 includes one of the sacrificial structures 106 on or over one of the insulating structures 108.

The stack structure 104 may exhibit an elongate shape (e.g., a rectangular shape) extending between a first end 111 and a second, opposing end 112. The first end 111 and the second, opposing end 112 of the stack structure 104 may each be, or may each later become, coupled to other components of a semiconductor device (e.g., a memory device) including the semiconductor device structure 100, such as one or more memory cell arrays (e.g., vertical memory cell arrays).

The stack structure 104, including each of the tiers 110 thereof, may be formed using conventional processes (e.g., conventional deposition processes, conventional material removal processes) and conventional processing equipment, which are not described in detail herein. By way of non-limiting example, the sacrificial structures 106 and the insulating structures 108 may be formed through one or more of in situ growth, spin-on coating, blanket coating, chemical vapor deposition (CVD), plasma enhanced chemical vapor deposition (PECVD), atomic layer deposition (ALD), and physical vapor deposition (PVD).

Figure 1B:
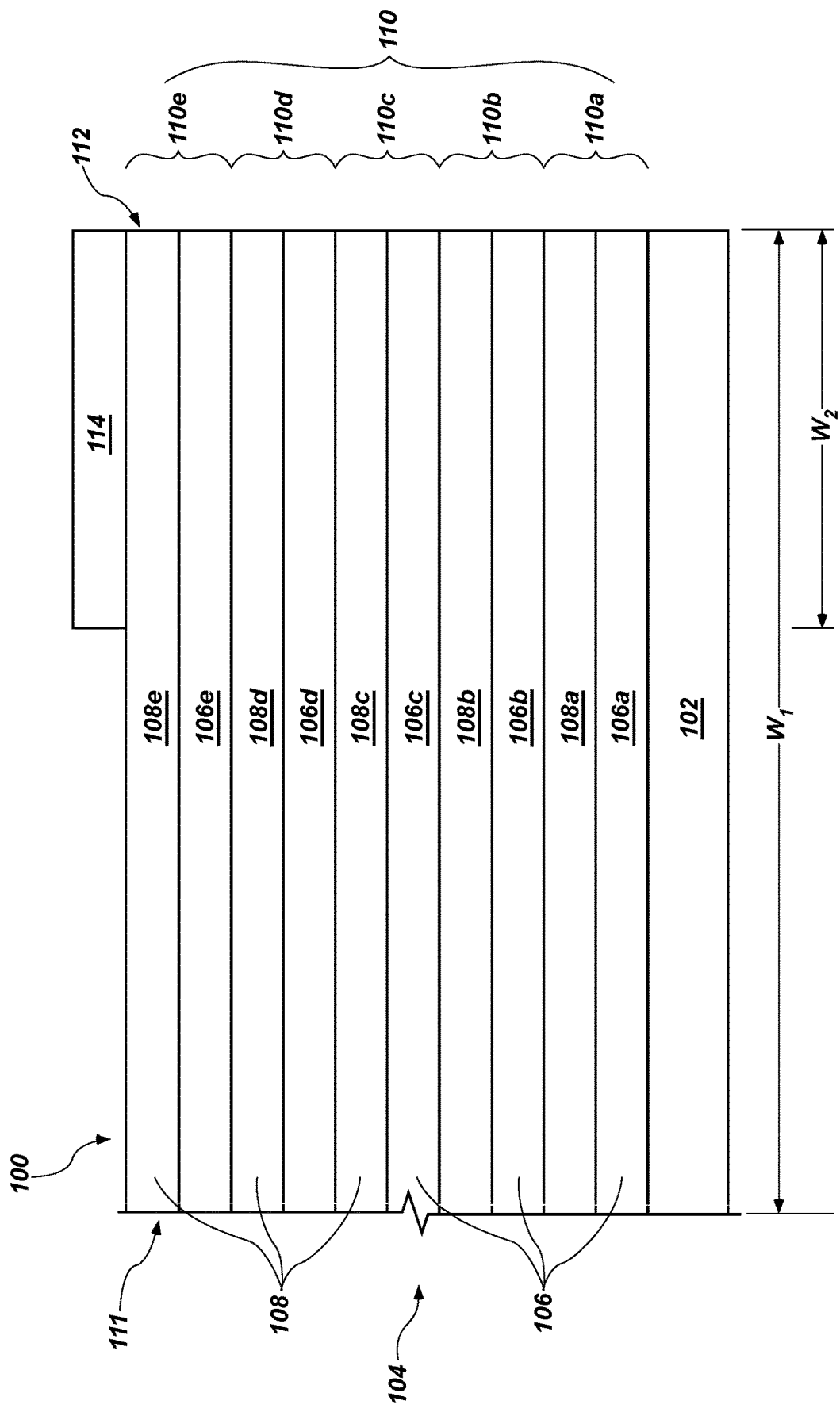

Referring next to FIG. 1B, a masking structure 114 (e.g., a hard mask structure) may be formed on or over a portion of the stack structure 104. The masking structure 114 may be formed of and include at least one material (e.g., at least one hard mask material) suitable for use as an etch mask to pattern portions of the stack structure 104 (e.g., portions of the tiers 110, including portions of the sacrificial structures 106 and portions of the insulating structures 108, remaining uncovered by the masking structure 114) to form at least one staircase structure, as described in further detail below. The stack structure 104 may be selectively etchable relative to the masking structure 114. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater. As a non-limiting example, at least in embodiments wherein the sacrificial structures 106 comprise silicon nitride and the insulating structures 108 comprise silicon dioxide, or vice versa, the masking structure 114 may be formed of and include one or more of metal-doped carbon, polysilicon, tungsten, and aluminum. As another non-limiting example, at least in embodiments wherein the sacrificial structures 106 comprise polycrystalline silicon (e.g., undoped polycrystalline silicon, doped polycrystalline silicon) and the insulating structures 108 comprise silicon dioxide, or vice versa, the masking structure 114 may be formed of and include at one or more of metal-doped carbon, silicon nitride, tungsten, and aluminum. If the masking structure 114 is formed of and includes metal-doped carbon, the metal may, for example, comprise one or more of boron, tungsten, and nickel, and may constitute from about 1.0 weight percent (wt %) to about 30.0 wt % of the metal-doped carbon. The masking structure 114 may be homogeneous (e.g., may comprise a single material layer), or may be heterogeneous (e.g., may comprise a stack exhibiting at least two different material layers).

The dimensions and position of the masking structure 114 may be selected at least partially based on desired positions and desired dimensions of one or more staircase structures to be subsequently formed in the stack structure 104. By way of non-limiting example, as shown in FIG. 1B, the masking structure 114 may have a width W2 less than the width $W_1$ of the stack structure 104, and may be non-centrally positioned over the stack structure 104. Widths of portions of the stack structure 104 remaining uncovered by (e.g., not underlying) the masking structure 114 may correspond to (e.g., be the same as) widths of the one or more staircase structures to be subsequently formed in the stack structure 104. In additional embodiments, the masking structure 114 may exhibit one or more of a different width W2, and a different position over the substrate 102. As a non-limiting example, the masking structure 114 may have a width W2 less than the width $W_1$ of the stack structure 104, and may be centrally positioned on or over the stack structure 104. The masking structure 114 may be formed on or over the stack structure 104 to any desired thickness. In some embodiments, the masking structure 114 exhibits a thickness within a range of from about 10 nanometers (nm) to about 500 nm (e.g., from about 10 nm to about 300 nm, or from about 10 nm to about 100 nm).

The masking structure 114 may be formed using conventional processes (e.g., conventional deposition processes, such as at least one of in situ growth, spin-on coating, blanket coating, CVD, PECVD, ALD, and PVD; conventional photolithography processes; conventional material removal processes) and conventional processing equipment, which are not described in detail herein.

Figure 1C:
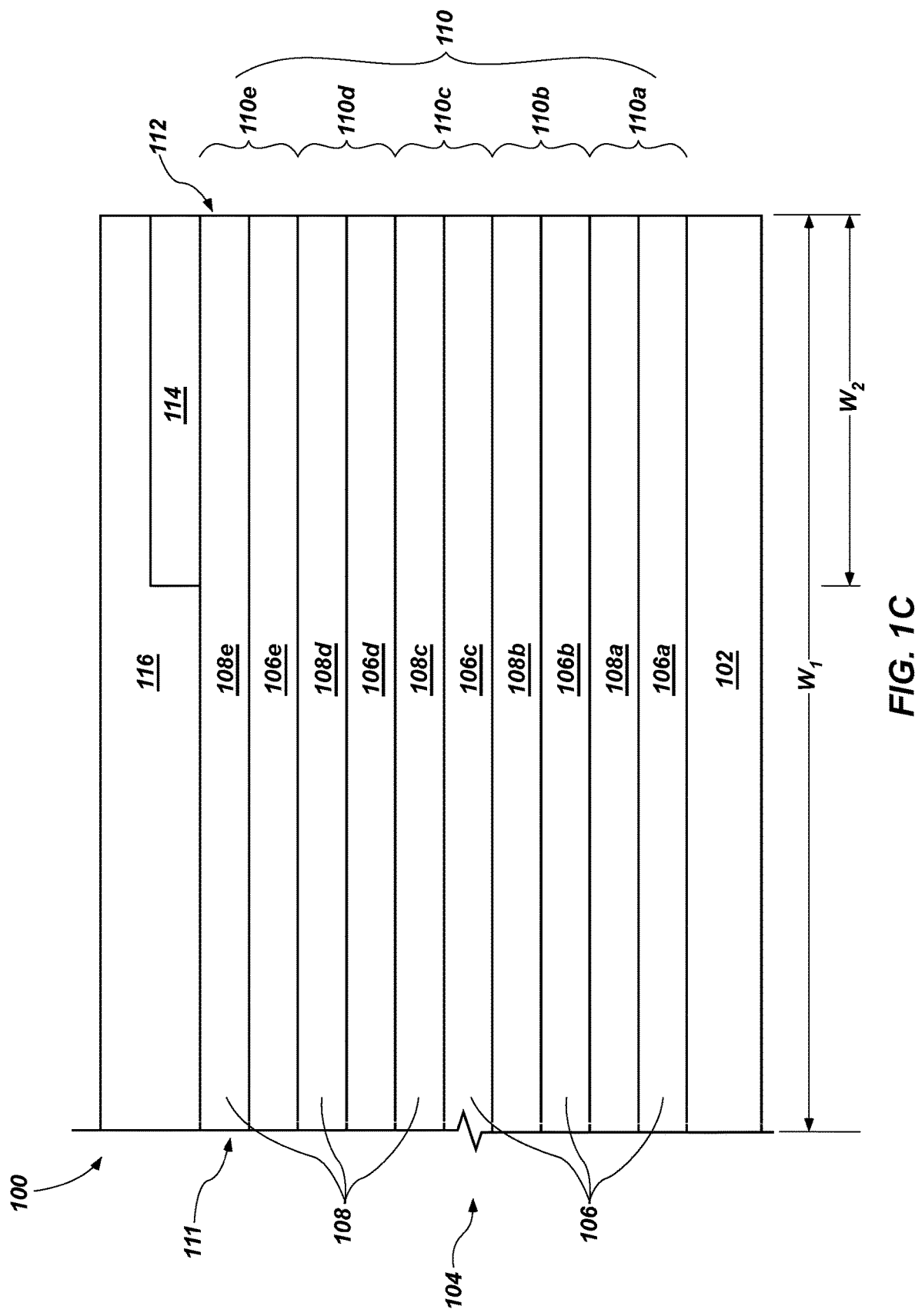

Referring next to FIG. 1C, a photoresist 116 may be formed on or over the exposed (e.g., uncovered) portions of the stack structure 104 and the masking structure 114. For example, as shown in FIG. 1C, the photoresist 116 may be formed on portions of at least one upper surface of the stack structure 104 (e.g., on portions of an upper surface of the fifth insulating structure 108e) remaining uncovered by the masking structure 114, and on surfaces (e.g., at least one upper surface, at least one side surface) of the masking structure 114. The photoresist 116 may function as a mask to remove (e.g., etch) portions of the tiers 110 of the sacrificial structures 106 and the insulating structures 108 and form a stair step structure, as described in further detail below. The photoresist 116 may be formed of and include conventional photoresist material, such as a conventional positive tone photoresist material, or a conventional negative tone photoresist material. Suitable photoresist materials are known in the art, and are, therefore, not described in detail herein. The photoresist 116 may be compatible with 13.7 nm, 157 nm, 193 nm, 248 nm, or 365 nm wavelength systems; with 193 nm wavelength immersion systems; and/or with electron beam lithographic systems.

The photoresist 116 may be formed to be non-conformal with the topography of the stack structure 104 and the masking structure 114. For example, as shown in FIG. 1C, the photoresist 116 may be formed to exhibit a substantially planar upper surface that does not conform to (e.g., is not the same as) a non-planar topography of an interface between the photoresist 116 and portions of the stack structure 104 and the masking structure 114 adjacent thereto (e.g., directly thereunder). Put another way, an upper boundary (e.g., upper surface) of the photoresist 116 may be substantially planar, and a lower boundary (e.g., lower surface) of the photoresist 116 may be at least partially non-planar. The at least partially non-planar topography of the lower boundary may complement the non-planar topography of portions of the stack structure 104 and the masking structure 114 adjacent the lower boundary. Accordingly, the photoresist 116 may exhibit variable (e.g., non-uniform, non-constant) thickness across the width (e.g., the width $W_1$) thereof. For example, as shown in FIG. 1C, portions of the photoresist 116 formed on or over portions of the stack structure 104 uncovered by the masking structure 114 may be thicker than other portions of the photoresist 116 formed on or over the masking structure 114.

The photoresist 116 may be formed using conventional processes (e.g., conventional deposition processes, such as at least one of in situ growth, spin-on coating, blanket coating, CVD, PECVD, ALD, and PVD; conventional material removal processes) and conventional processing equipment, which are not described in detail herein.

Figure 1D:
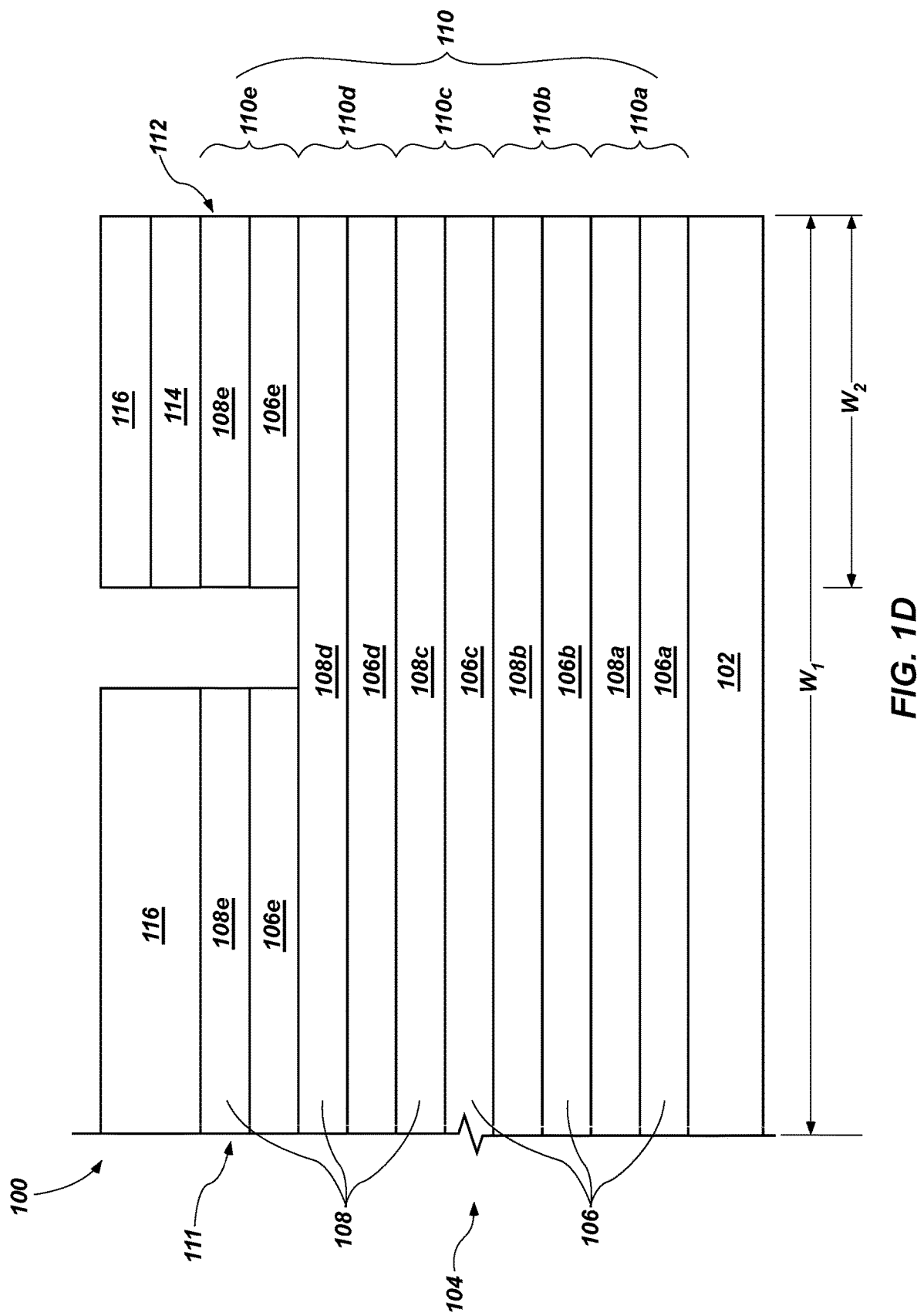

Referring next to FIG. 1D, the semiconductor device structure 100 may be subjected to a first material removal process to remove a first portion of the photoresist 116, and to remove (e.g., etch) a portion of the fifth tier 110e (e.g., including a portion of each of the fifth insulating structure 108e and the fifth sacrificial structure 106e) to a first width using the masking structure 114 and a remaining portion of the photoresist 116 (e.g., a remaining portion of the photoresist 116 not overlying the masking structure 114) as removal (e.g., etching) masks. The first width may correspond to a width of a first step (e.g., a longitudinally lowest step, a step most longitudinally proximate the substrate 102) to be formed through subsequent processing (e.g., subsequent material removal processes), as described in further detail below. The first step may, for example, comprise portions of the first sacrificial structure 106a and the first insulating structure 108a not covered by at least one other of the tiers 110 of the sacrificial structures 106 and the insulating structures 108.

As shown in FIG. 1D, in some embodiments, the first material removal process may be controlled so that the portion of the photoresist 116 overlying the masking structure 114 is substantially maintained (e.g., is not substantially removed by the first material removal process). Accordingly, a width of the first portion of the photoresist 116 removed by the first material removal process may be substantially the same as the first width of the fifth tier 110e removed by the first material removal process. In additional embodiments, some of the photoresist 116 overlying the masking structure 114 is removed by the first material removal process. For example, some of the photoresist 116 overlying the masking structure 114 and positioned laterally proximate a lateral boundary (e.g., a side surface) of the masking structure 114 may be removed in addition to some of the photoresist 116 not overlying the masking structure 114. Accordingly, in such embodiments, a width of the first portion of the photoresist 116 removed by the first material removal process may be different than (e.g., greater than) the first width of the fifth tier 110e removed by the first material removal process.

The first material removal process may include photolithographically processing the photoresist 116 to remove the first portion of the photoresist 116, and then removing a portion of the fifth tier 110e (e.g., including a portion of each of the fifth insulating structure 108e and the fifth sacrificial structure 106e) not covered by one or more of the masking structure 114 and remaining portions of the photoresist 116 using at least one etching process. For example, the photoresist 116 may be exposed to an appropriate wavelength (e.g., 13.7 nm, 157 nm, 193 nm, 248 nm, 365 nm) of radiation through a reticle and then developed to remove the first portion of the photoresist 116 and expose a portion of the fifth insulating structure 108e, the exposed portion of the fifth insulating structure 108e may be selectively removed using an etching process (e.g., an anisotropic etching process, such as a dry etching process) to expose a portion of the fifth sacrificial structure 106e, and then the exposed portion of the fifth sacrificial structure 106e may be selectively removed using another etching process (e.g., another anisotropic etching process, such as another dry etching process) to expose a portion of the fourth insulating structure 108d. Process parameters (e.g., radiation wavelengths, developers, etchants, exposure times) of the first material removal process may be tailored to the configurations (e.g., material compositions, material distributions, thicknesses, arrangements) of the masking structure 114, the photoresist 116, the insulating structures 108, and the sacrificial structures 106, and are not described in detail herein.

Figure 1E:
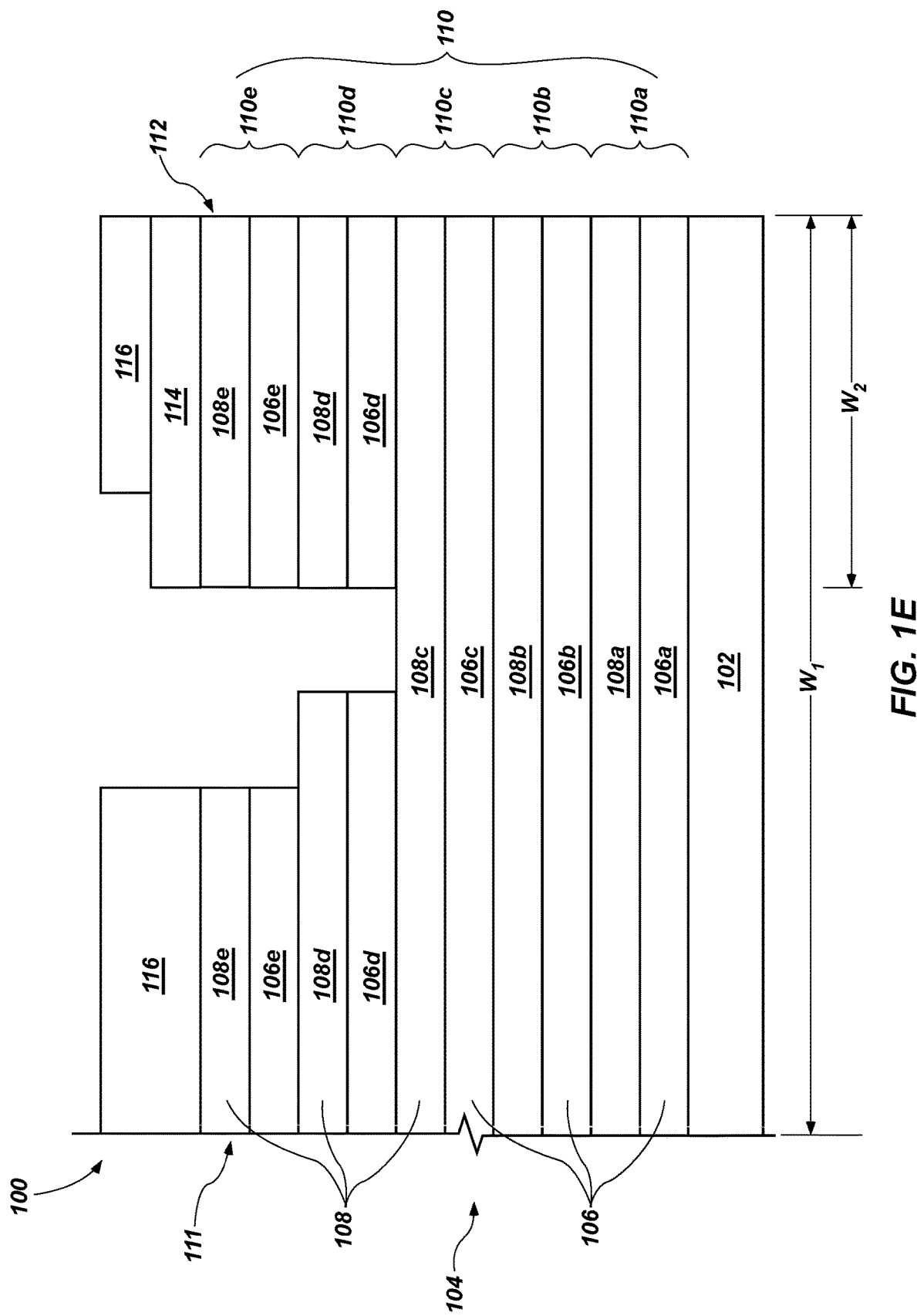

Referring next to FIG. 1E, the semiconductor device structure 100 may be subjected to a second material removal process to remove (e.g., trim) a second portion of the photoresist 116, and to remove (e.g., etch) additional portions of the tiers 110 of the stack structure 104. The second material removal process may remove another portion of the fifth tier 110e (e.g., including another portion of each of the fifth insulating structure 108e and the fifth sacrificial structure 106e) to a second width, and may also remove a portion of the fourth tier 110d (e.g., including a portion of each of the fourth insulating structure 108d and the fourth sacrificial structure 106d) to the first width. The aforementioned removal of the additional portions of the tiers 110 may employ the masking structure 114 and a newly remaining portion of the photoresist 116 (e.g., a newly remaining portion of the photoresist 116 not overlying the masking structure 114) as removal (e.g., etching) masks. The second width may correspond to a width of a second step (e.g., a step longitudinally overlying and adjacent a first step) to be formed through subsequent processing (e.g., subsequent material removal processes), as described in further detail below. The second step may, for example, comprise portions of the second sacrificial structure 106b and the second insulating structure 108b not covered by at least one other of the tiers 110 of the sacrificial structures 106 and the insulating structures 108.

The magnitude of the second width of the fifth tier 110e removed by the second material removal process may be substantially the same as, or may be different than the first width of the fifth tier 110e removed by the first material removal process. In some embodiments, the magnitude of the second width of the fifth tier 110e removed by the second material removal process may be substantially the same as the first width of the fifth tier 110e removed by the first material removal process. In additional embodiments, the magnitude of the second width of the fifth tier 110e removed by the second material removal process is greater than the first width of the fifth tier 110e removed by the first material removal process. In further embodiments, the magnitude of the second width of the fifth tier 110e removed by the second material removal process is less than the first width of the fifth tier 110e removed by the first material removal process.

The second material removal process may include photolithographically processing the photoresist 116 to remove the second portion of the photoresist 116, and then removing portions of the fifth tier 110e (e.g., including a portion of each of the fifth insulating structure 108e and the fifth sacrificial structure 106e) and the fourth tier 110d (e.g., including a portion of each of the fifth insulating structure 108e and the fifth sacrificial structure 106e) not covered by one or more of the masking structure 114 and newly remaining portions of the photoresist 116 using at least one etching process. For example, the photoresist 116 may be exposed to an appropriate wavelength (e.g., 13.7 nm, 157 nm, 193 nm, 248 nm, 365 nm) of radiation through a reticle and then developed to trim the second portion from the photoresist 116 and expose an additional portion of the fifth insulating structure 108e, the additional exposed portion of the fifth insulating structure 108e and an exposed portion of the fourth insulating structure 108d may be selectively removed using an etching process (e.g., an anisotropic etching process, such as a dry etching process) to expose an additional portion of the fifth sacrificial structure 106e and a portion of the fourth sacrificial structure 106d, and then the additional exposed portion of the fifth sacrificial structure 106e and the exposed portion of the fourth sacrificial structure 106d may be selectively removed using another etching process (e.g., another anisotropic etching process, such as another dry etching process) to expose an additional portion of the fourth insulating structure 108d and a portion of the third insulating structure 108c. Process parameters (e.g., radiation wavelengths, developers, etchants, exposure times) of the second material removal process may be tailored to the configurations (e.g., material compositions, material distributions, thicknesses, arrangements) of the masking structure 114, the photoresist 116, the insulating structures 108, and the sacrificial structures 106, and are not described in detail herein. In some embodiments, a duration and an end-point scheme of the second material removal process is substantially the same as a duration and an end-point scheme of the first material removal process. In additional embodiments, one or more of the duration and the end-point scheme of the second material removal process is different than one or more of the duration and the end-point scheme of the first material removal process.

Figure 1F:
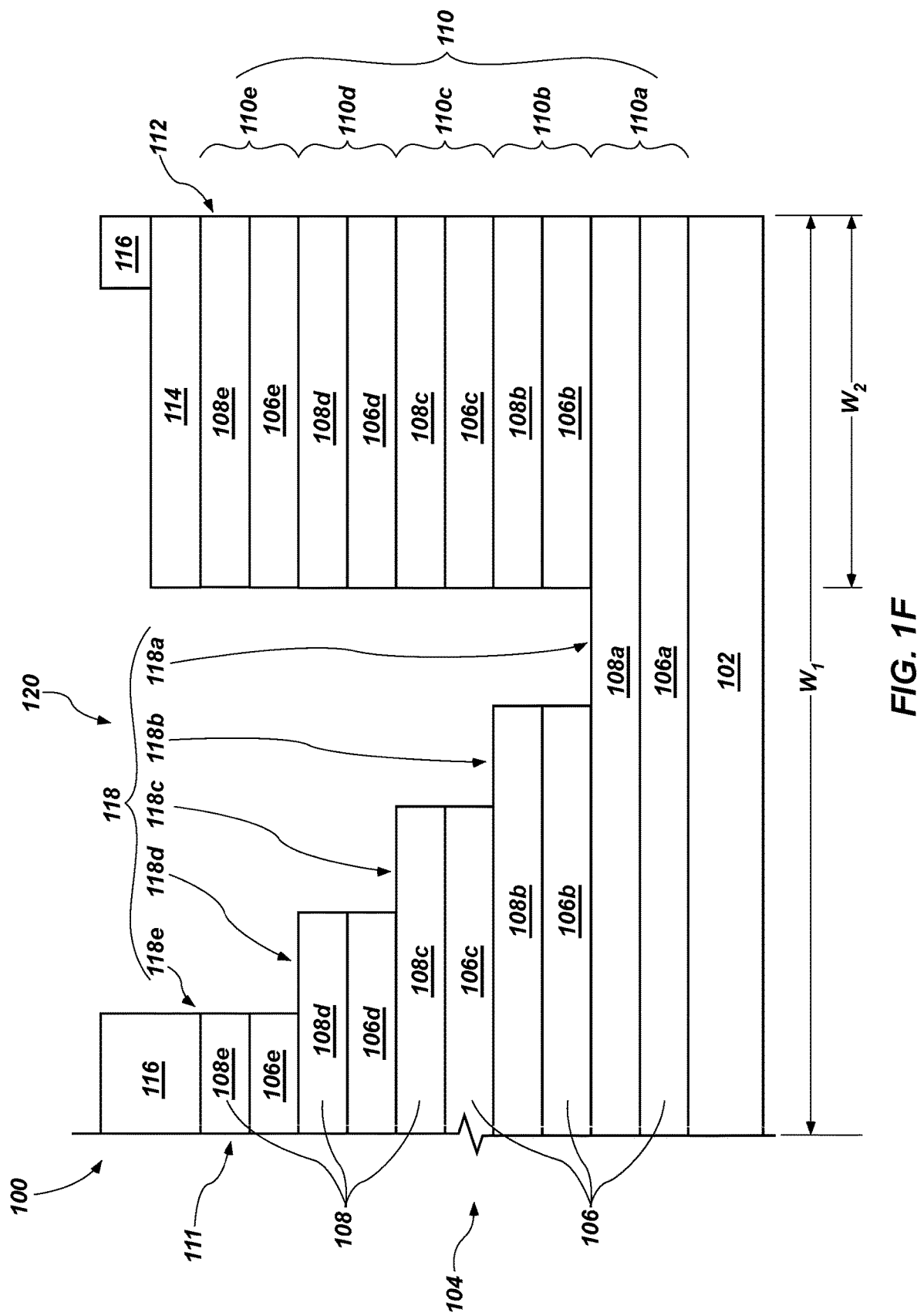

Referring next to FIG. 1F, the semiconductor device structure 100 may be subjected to additional material removal processes to remove (e.g., trim) additional portions of the photoresist 116, the sacrificial structures 106, and the insulating structures 108 and form a stair step structure 120 including steps 118 defined by portions (e.g., ends, exposed surfaces) of the tiers 110. For example, as shown in FIG. 1F, the additional material removal processes may form a first step 118a defined by an exposed surface of the first tier 110a, a second step 118b defined by a lateral end of the second tier 110b, a third step 118c defined by a lateral end of the third tier 110c, a fourth step 118d defined by a lateral of the fourth tier 110d, and a fifth step 118e defined by a lateral end of the fifth tier 110e. The additional material removal processes may remove (e.g., trim) additional portions of the photoresist 116 corresponding to widths of the steps 118. For example, a third material removal process may remove a third width of the photoresist 116 corresponding to a width of the third step 118c, and a fourth material removal process may remove a fourth width of the photoresist 116 corresponding to a width of the fourth step 118d. The width of the fifth step 118e of the stair step structure 120 may correspond to at least a portion of the fifth tier 110e remaining following the additional material removal processes.

The number of steps 118 included in each of the stair step structure 120 may be substantially the same as (e.g., equal to) or may be different than (e.g., less than, or greater than) the number of tiers 110 in the stack structure 104. In some embodiments, the number of steps 118 included in the stair step structure 120 is the same as the number of tiers 110 in the stack structure 104. As a non-limiting example, as shown in FIG. 1F, the stair step structure 120 may include five (5) steps 118 at least partially defined by portions (e.g., exposed upper surfaces, exposed side surfaces) of the five (5) tiers 110 (e.g., tiers 110a through 110e) of the stack structure 104. In additional embodiments, the stair step structure 120 may include a different number of steps 118 (e.g., less than five (5) steps 118, greater than five (5) steps 118). For example, in additional embodiments, the number of steps 118 included in the stair step structure 120 is less than the number of tiers 110 in the stack structure 104. As a non-limiting example, the stair step structure 120 may include less than five (5) steps 118 (e.g., four (4) steps 118, three (3) steps 118, two (2) steps 118, etc.) at least partially defined by portions (e.g., exposed upper surfaces, exposed side surfaces) of less than all of the five (5) tiers 110 of the stack structure 104.

The magnitude of each additional width of the photoresist 116 removed by each of the additional material removal process may be substantially the same, or at least one additional width removed by at least one of the additional material removal processes may be different than at least one other additional width removed by at least one of the additional material removal processes. In some embodiments, the magnitudes of the additional widths of the tiers 110 removed by the additional material removal process are substantially the same as one another. For example, the magnitudes of the additional widths of the tiers 110 removed by the additional material removal process may each be substantially the same as the first width of the fifth tier 110e removed by the first material removal process and/or the second width of the fifth tier 110e removed by the second material removal process. In additional embodiments, the magnitude of at least one additional width of the tiers 110 removed by at least one of the additional material removal processes is greater than the magnitude of at least one other additional width of the tiers 110 removed by at least one other of the additional material removal processes. In further embodiments, the magnitude of at least one additional width of the tiers 110 removed by at least one of the additional material removal processes is less than the magnitude of at least one other additional width of the tiers 110 removed by at least one other of the additional material removal processes.

The additional material removal processes may each include photolithographically processing the photoresist 116 to remove an additional width of the photoresist 116, and then removing portions of the tiers 110 not covered by one or more of the masking structure 114 and newly remaining portions of the photoresist 116 using at least one etching process. Process parameters (e.g., radiation wavelengths, developers, etchants, exposure times) of the additional material removal processes may be tailored to the configurations (e.g., material compositions, material distributions, thicknesses, arrangements) of the masking structure 114, the photoresist 116, the insulating structures 108, and the sacrificial structures 106, and are not described in detail herein. In some embodiments, a duration and an end-point scheme of the one or more of the additional material removal processes is substantially the same as a duration and an end-point scheme of each of the first material removal process, the second material removal process, and each other of the additional material removal processes. In additional embodiments, one or more of a duration and an end-point scheme of the one or more of the additional material removal processes is different than one or more of a duration and an end-point scheme of one or more of the first material removal process, the second material removal process, and at least one other of the additional material removal processes.

Thus, in accordance with embodiments of the disclosure, a method of forming a semiconductor device structure comprises forming a stack structure over a substrate, the stack structure comprising tiers each independently comprising a sacrificial structure and an insulating structure longitudinally adjacent the sacrificial structure. A masking structure is formed over a portion of the stack structure. A photoresist is formed over the masking structure and over additional portions of the stack structure not covered by the masking structure. The photoresist and the stack structure are subjected to a series of material removal processes to selectively remove portions of the photoresist and portions of the stack structure not covered by one or more of the masking structure and remaining portions of the photoresist to form a stair step structure.

Figure 1G:
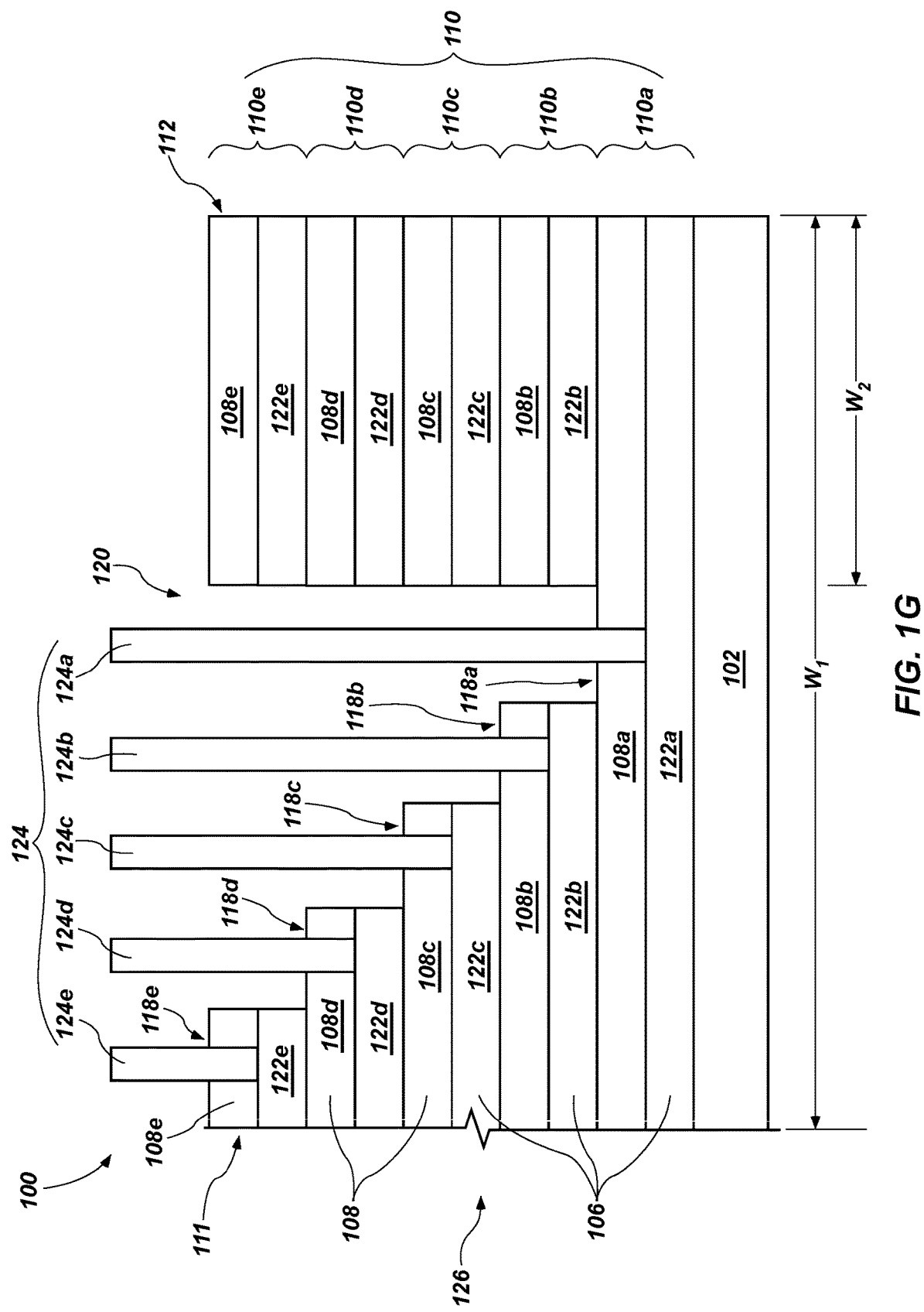

Referring next to FIG. 1G, following the formation of the stair step structure 120 the semiconductor device structure 100 may be subjected to additional processing. By way of non-limiting example, and as described in further detail below, remaining portions of the masking structure 114 (FIG. 1F) and the photoresist 116 (FIG. 1F) (if any) may be removed, at least some portions of the sacrificial structures 106 (FIG. 1F) of the tiers 110 may be removed and replaced with conductive structures 122 (e.g., conductive gates, conductive plates) to form a conductive stack structure 126, and conductive contact structures 124 may be formed to provide electrical contact to the conductive structures 122 of the conductive stack structure 126.

The remaining portions of the masking structure 114 (FIG. 1F) and the photoresist 116 (FIG. 1F) (if any) may each independently be removed using one or more conventional material removal processes, which are not described in detail herein. By way of non-limiting example, the remaining portions of the masking structure 114 and the photoresist 116 may each independently be selectively removed through at least one conventional etching process (e.g., a conventional wet etching process, a conventional dry etching process). The remaining portions of the masking structure 114 and the photoresist 116 may be removed simultaneously, sequentially, or a combination thereof. For example, remaining portions of the photoresist 116 may be removed using a first material removal process, and then remaining portions of the masking structure 114 may be removed using a second material removal process. As another example, remaining portions of each of the masking structure 114 and the photoresist 116 may be removed substantially simultaneously using one or more material removal processes.

The conductive structures 122 of the conductive stack structure 126 may be formed of and include at least one conductive material, such as a metal, a metal alloy, a conductive metal oxide, a conductive metal nitride, a conductive metal silicide, a conductively-doped semiconductor material, or combinations thereof. By way of non-limiting example, the conductive structures 122 may be formed of and include one or more of tungsten, tungsten nitride, nickel, tantalum, tantalum nitride, tantalum silicide, platinum, copper, silver, gold, aluminum, molybdenum, titanium, titanium nitride, titanium silicide, titanium silicon nitride, titanium aluminum nitride, molybdenum nitride, iridium, iridium oxide, ruthenium, ruthenium oxide, and conductively doped silicon. In some embodiments, the conductive structures 122 are formed of and include tungsten.

The number of conductive structures 122 included in the conductive stack structure 126 may be substantially the same as (e.g., equal to) or may be different than (e.g., less than, or greater than) the number of tiers 110 in the conductive stack structure 126. In some embodiments, the number of conductive structures 122 included in the conductive stack structure 126 is the same as the number of tiers 110 in the conductive stack structure 126. As a non-limiting example, as shown in FIG. 1G, the conductive stack structure 126 may include five (5) conductive structures 122 (e.g., a first conductive structure 122a, a second conductive structure 122b, a third conductive structure 122c, a fourth conductive structure 122d, and a fifth conductive structure 122e) formed by removing and replacing portions of the five (5) sacrificial structures 106 (FIG. 1F) (e.g., the first sacrificial structure 106a, the second sacrificial structure 106b, the third sacrificial structure 106c, the fourth sacrificial structure 106d, and the fifth sacrificial structure 106e) of the stack structure 104 (FIG. 1F). In additional embodiments, the conductive stack structure 126 may include a different number of conductive structures 122 (e.g., less than five (5) conductive structures 122, greater than five (5) conductive structures 122). For example, in additional embodiments, the number of conductive structures 122 included in the conductive stack structure 126 is less than the number of tiers 110 in the conductive stack structure 126.

The conductive structures 122 may be formed by selectively removing portions of the sacrificial structures 106 (FIG. 1F) relative to the insulating structures 108 (FIG. 1F) to form recessed regions laterally extending into each of the tiers 110, and then at least partially (e.g., substantially) filling the recessed regions with at least one conductive material. The recessed regions may be formed by subjecting the stack structure 104 to at least one etching processing (e.g., an isotropic etching process) employing an etch chemistry in which the material (e.g., insulating material, semiconductive material) of the sacrificial structures 106 is selectively removed relative to that of the insulating structures 108. By way of non-limiting example, if the sacrificial structures 106 are formed of and include silicon nitride and the insulating structures 108 are formed of and include silicon dioxide, the stack structure 104 may be exposed to an etchant comprising phosphoric acid to selectively remove portions of the insulating structures 108 adjacent exposed lateral surfaces of the stack structure 104. Thereafter, the conductive material may be formed (e.g., delivered, deposited) within recessed regions to form the conductive structures 122.

In additional embodiments, rather than selectively removing and replacing portions of the sacrificial structures 106 (FIG. 1F) to form the conductive stack structure 126, portions of the insulating structures 108 (FIG. 1F) may instead be selectively removed and replaced with conductive material to form a conductive stack structure. Aside from the sequence (e.g., order) of the alternating conductive structures and insulating structures of such a conductive stack structure, and differences (if any) associated with material properties of the sacrificial structures 106 as compared to those of the insulating structures 108, such a conductive stack structure may be substantially similar to and may have little or no difference in terms of functionality and/or operability as compared to the conductive stack structure 126 depicted in FIG. 1G.

Thus, in accordance with embodiments of the disclosure, a method of forming a semiconductor device structure comprises forming a non-conductive stack structure comprising non-conductive tiers over a substrate, each of the non-conductive tiers independently comprising at least two structures longitudinally adjacent one another and having different material compositions than one another. A masking structure is formed over a portion of an upper surface of the non-conductive stack structure, the masking structure having a different material composition than the at least two structures of each of the non-conductive tiers of the non-conductive stack structure. A non-conformal photoresist is formed over exposed surfaces of the masking structure and the non-conductive stack structure. The non-conductive stack structure is subjected to multiple material removal processes using the masking structure and portions of the photoresist as masks to form a stair step structure in the non-conductive stack structure, the stair step structure positioned laterally adjacent the masking structure. At least a portion of one of the least two structures of each of the non-conductive tiers is replaced with a conductive material to form a conductive stack structure comprising partially conductive tiers over the substrate.

With continued reference to FIG. 1G, the conductive contact structures 124 may be formed to provide electrical contact to one or more (e.g., each) of the conductive structures 122 (e.g., the first conductive structure 122a of the first tier 110a, the second conductive structure 122b of the second tier 110b, the third conductive structure 122c of the third tier 110c, the fourth conductive structure 122d of the fourth tier 110d, and the fifth conductive structure 122e of the fifth tier 110e) of the conductive stack structure 126. The conductive contact structures 124 may, for example, be formed on or over portions of the conductive structures 122 partially defining the steps 118 of the stair step structure 120. For example, as shown in FIG. 1G, a first conductive contact structure 124a may be formed on or over a portion of the first conductive structure 122a partially defining the first step 118a, a second conductive contact structure 124b may be formed on or over a portion of the second conductive structure 122b partially defining the second step 118b, a third conductive contact structure 124c may be formed on or over a portion of the third conductive structure 122c partially defining the third step 118c, a fourth conductive contact structure 124d may be formed on or over a portion of the fourth conductive structure 122d partially defining the fourth step 118d, and a fifth conductive contact structure 124e may be formed on or over a portion of the fifth conductive structure 122e partially defining the fifth step 118e. In additional embodiments, the conductive contact structures 124 may be formed to exhibit a configuration different than that shown in FIG. 1G. By way of non-limiting example, the conductive contact structures 124 may be formed to longitudinally extend from each of the conductive structures 122, through the stair step structure 120, and to the substrate 102 (e.g., longitudinally toward the substrate 102 rather than or in addition to longitudinally away from the substrate 102). In other words, this disclosure is not limited to forming conductive contact structures 124 longitudinally extending from the conductive structures 122 of the semiconductor device structure 100 in a direction longitudinally away from the substrate 102.

The conductive contact structures 124 may be formed of and include at least one conductive material, such as a metal (e.g., tungsten, titanium, molybdenum, niobium, vanadium, hafnium, tantalum, chromium, zirconium, iron, ruthenium, osmium, cobalt, rhodium, iridium, nickel, palladium, platinum, copper, silver, gold, aluminum), a metal alloy (e.g., a cobalt-based alloy, an iron-based alloy, a nickel-based alloy, an iron- and nickel-based alloy, a cobalt- and nickel-based alloy, an iron- and cobalt-based alloy, a cobalt- and nickel- and iron-based alloy, an aluminum-based alloy, a copper-based alloy, a magnesium-based alloy, a titanium-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped silicon, conductively-doped germanium, conductively-doped silicon germanium), or combinations thereof. Each of the conductive contact structures 124 have substantially the same material composition, or at least one of the conductive contact structures 124 may have a different material composition than at least one other of the conductive contact structures 124.

The number of conductive contact structures 124 included in the semiconductor device structure 100 may be substantially the same as (e.g., equal to), or may be different than (e.g., less than, or greater than) the number of tiers 110 in the conductive stack structure 126. In some embodiments, the number of conductive contact structures 124 included in the semiconductor device structure 100 is the same as the number of tiers 110 included in the conductive stack structure 126. As a non-limiting example, as shown in FIG. 1G, the semiconductor device structure 100 may include five (5) conductive contact structures 124 each independently coupled to one of the five (5) tiers 110 (e.g., tiers 110a through 110e) of the conductive stack structure 126. In additional embodiments, the semiconductor device structure 100 may include a different number of conductive contact structures 124 (e.g., less than five (5) conductive contact structures 124, greater than five (5) conductive contact structures 124). For example, in additional embodiments, the number of the conductive contact structures 124 included in the semiconductor device structure 100 is less than the number of tiers 110 included in the conductive stack structure 126. As another example, in further embodiments, the number of the conductive contact structures 124 included in the semiconductor device structure 100 is greater than the number of tiers 110 included in the conductive stack structure 126.

The conductive contact structures 124 may be substantially uniformly (e.g., evenly) spaced apart from one another, or may be non-uniformly (e.g., non-evenly) spaced apart from one another. A magnitude of a distance between adjacent conductive contact structures 124 may at least partially depend on the widths of the steps 118 over which the adjacent conductive contact structures 124 are positioned. The conductive contact structures 124 may be formed to be generally centrally positioned on or over each of the steps 118 of the stair step structure 120. Accordingly, distances between adjacent conductive contact structures 124 may be substantially the same if the adjacent steps 118 associated with the adjacent conductive contact structures 124 are substantially the same, or vary in accordance with variance (e.g., differences) in the widths of the adjacent steps 118 associated with the adjacent conductive contact structures 124.

The conductive contact structures 124 may be formed through conventional processes (e.g., conventional material deposition processes, conventional material removal processes), which are not described in detail herein. By way of non-limiting example, an insulating material (e.g., a silicon oxide, silicon nitride, borophosphosilicate glass, a spin-on dielectric) may be formed on or over at least the stair step structure 120 of the semiconductor device structure 100, openings (e.g., vias, apertures) may be formed through the insulating material and portions of the insulating structures 108 partially defining the steps 118 of the tiers 110 to expose contact regions of the underlying conductive structures 122, and the openings may be filled with a conductive material to form the conductive contact structures 124.

Figure 2:
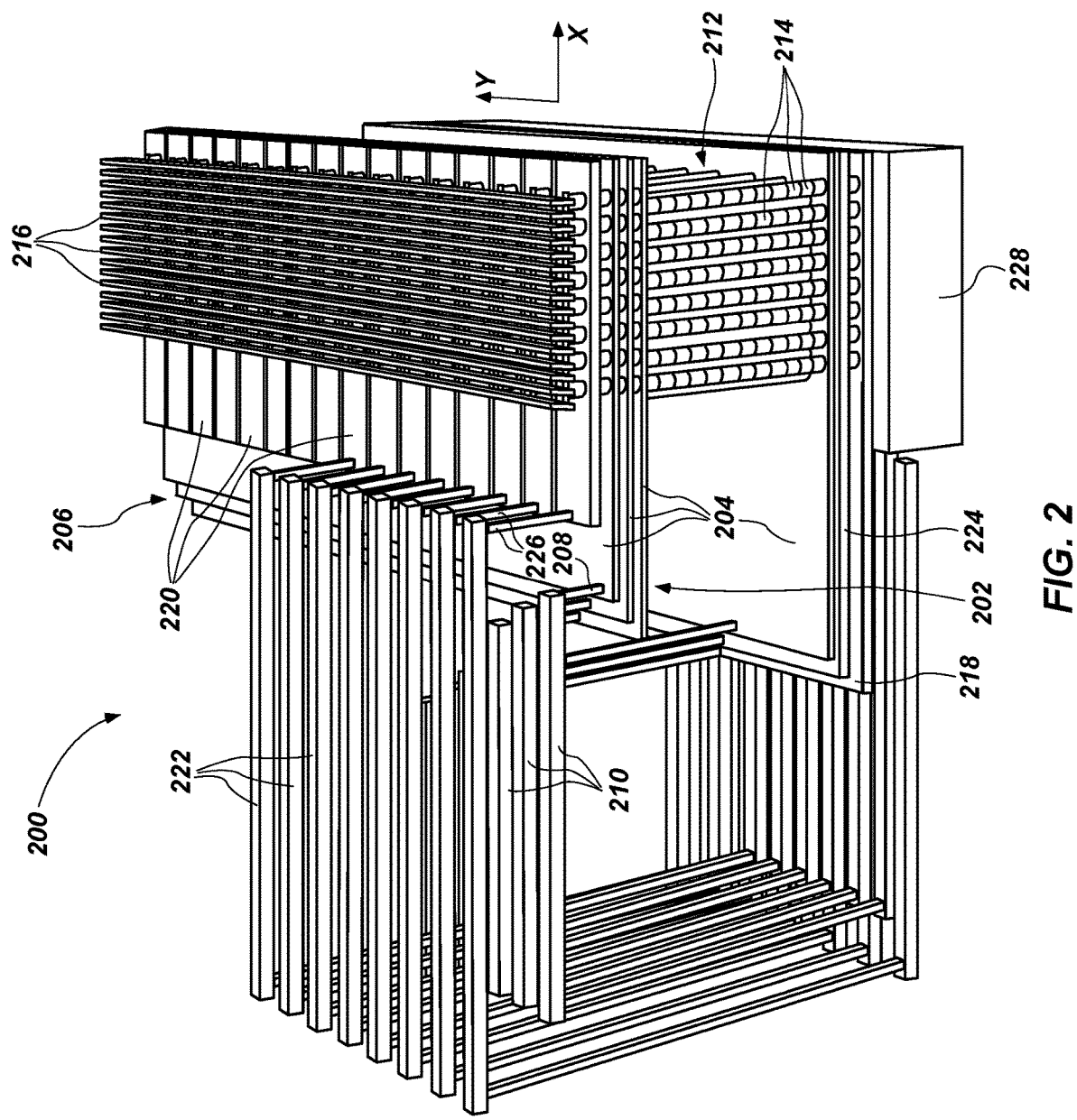
FIG. 2 is a partial cutaway perspective view of a vertical memory device including a semiconductor device structure having a stair step structure, in accordance with an embodiment of the disclosure.

FIG. 2 illustrates a partial cutaway perspective view of a portion of a semiconductor device 200 (e.g., a vertical memory device, such as a 3D NAND Flash memory device) including a semiconductor device structure 202 including tiers 204 of conductive structures and insulative structures defining a stair step structure 206, and contact structures 208 electrically connected to steps of the stair step structure 206. The semiconductor device structure 202 (e.g., including the tiers 204 of conductive structures and insulative structures, the stair step structure 206, and the contact structures 208) may be substantially similar to and may be formed in substantially the same manner as the semiconductor device structure 100 previously described in with respect to FIGS. 1A through 1G. The semiconductor device 200 may further include vertical strings 212 of memory cells 214 coupled to each other in series, data lines 216 (e.g., bit lines), a source tier 218, access lines 210, first select gates 220 (e.g., upper select gates, drain select gates (SGDs)), select lines 222, a second select gate 224 (e.g., a lower select gate, a source select gate (SGS)), and additional contact structures 226. The vertical strings 212 of memory cells 214 extend vertically and orthogonal to conductive lines and tiers (e.g., the data lines 216, the source tier 218, the tiers 204 of the semiconductor device structure 202, the access lines 210, the first select gates 220, the select lines 222, the second select gate 224), and the contact structures 208 and the additional contact structures 226 may electrically couple components to each other as shown (e.g., the select lines 222 to the first select gates 220, the access lines 210 to the tiers 204 of the semiconductor device structure 202). The semiconductor device 200 may also include a control unit 228 positioned below the memory cells 214, which may include one or more of string driver circuitry, pass gates, circuitry for selecting gates, circuitry for selecting conductive lines (e.g., the data lines 216, the access lines 210), circuitry for amplifying signals, and circuitry for sensing signals. The control unit 228 may, for example, be electrically coupled to the data lines 216, source tier 218, access lines 210, first select gates 220, and second select gate 224, for example.

Thus, in accordance with embodiments of the disclosure, a semiconductor device comprises a conductive stack structure, a single stair step structure, and conductive contact structures. The conductive stack structure comprises tiers each comprising at least one conductive structure and at least one insulating structure longitudinally adjacent the at least one conductive structure. The single stair step structure has steps comprising lateral ends of the tiers of the conductive stack structure, and is positioned laterally adjacent a substantially planar lateral surface of the conductive stack structure. The conductive contact structures are in physical contact with the steps of the single staircase structure.

The methods and structures of the disclosure may decrease the lateral dimensions used to form one or more stair step structures for a semiconductor device (e.g., a memory device, such as a 3D NAND Flash memory device) as compared to conventional methods and conventional structures. The reduction in the lateral dimensions may permit regions of the semiconductor device to be used for additional purposes (e.g., through vias, interconnect structures, control units) than may otherwise be possible for conventional stair step structure configurations. The methods and structures of the disclosure may reduce costs (e.g., manufacturing costs, material costs) and performance, scalability, efficiency, and simplicity as compared to conventional methods and structures.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A device, comprising:
   a stack structure comprising vertically alternating conductive structures and insulating structures arranged in tiers, each of the tiers individually comprising at least one of the conductive structures and at least one of the insulating structures;
   a staircase structure having steps comprising edges of at least some of the tiers of the stack structure, a lowermost step of the staircase structure positioned directly horizontally adjacent and continuous with a substantially planar surface of the stack structure vertically extending from a lowermost endpoint at an upper surface of the lowermost step of the staircase structure to an uppermost endpoint at an uppermost surface of the stack structure;
   contact structures on the steps of the staircase structure;
   conductive lines electrically connected to the contact structures;
   a source structure underlying the stack structure;
   data lines overlying the stack structure;
   an array of vertically extending strings of memory cells extending through the stack structure and electrically connected to the source structure and the data lines; and
   a control device vertically underlying the source structure and within horizontal boundaries of the array of vertically extending strings of memory cells, the control device electrically coupled to the conductive lines, the source structure, and the data lines.

2. The device of claim 1, wherein the lowermost step of the staircase structure has a different horizontal width than at least one other of the steps of the staircase structure.

3. The device of claim 1, wherein the lowermost step of the staircase structure has a smaller horizontal width than at least one other of the steps of the staircase structure.

4. The device of claim 1, wherein the lowermost step of the staircase structure has a greater horizontal width than at least one other of the steps of the staircase structure.

5. The device of claim 1, wherein a horizontal width of each of the steps of the staircase structure is substantially equal to a horizontal width of each other of the steps of the staircase structure.

6. The device of claim 1, wherein the contact structures are substantially centrally horizontally positioned on the steps of the staircase structure.

* * * * *